United States Patent
Shimizu et al.

(10) Patent No.: US 10,002,855 B2
(45) Date of Patent: Jun. 19, 2018

(54) LED MODULE WITH HERMETIC SEAL OF WAVELENGTH CONVERSION MATERIAL

(71) Applicant: Lumileds LLC, San Jose, CA (US)

(72) Inventors: Kentaro Shimizu, Eindhoven (NL); Brendan Jude Moran, Eindhoven (NL); Mark Melvin Butterworth, Eindhoven (NL); Oleg Borisovich Shchekin, Eindhoven (NL)

(73) Assignee: LUMILEDS LLC, San Jose, CA (US)

( * ) Notice: Subject to any disclaimer, the term of this patent is extended or adjusted under 35 U.S.C. 154(b) by 0 days. days.

(21) Appl. No.: 14/762,576

(22) PCT Filed: Feb. 10, 2014

(86) PCT No.: PCT/IB2014/058875
§ 371 (c)(1),
(2) Date: Jul. 22, 2015

(87) PCT Pub. No.: WO2014/122626
PCT Pub. Date: Aug. 14, 2014

(65) Prior Publication Data
US 2015/0371975 A1    Dec. 24, 2015

Related U.S. Application Data

(60) Provisional application No. 61/763,081, filed on Feb. 11, 2013.

(51) Int. Cl.
*H01L 33/00* (2010.01)
*H01L 25/075* (2006.01)
(Continued)

(52) U.S. Cl.
CPC ........ *H01L 25/0753* (2013.01); *H01L 33/486* (2013.01); *H01L 33/50* (2013.01);
(Continued)

(58) Field of Classification Search
CPC ..... H01L 33/483; H01L 33/486; H01L 33/50; H01L 33/501
(Continued)

(56) References Cited

U.S. PATENT DOCUMENTS 7,087,465 B2    8/2006  Collins, III
8,922,118 B2   12/2014  Yamanaka et al.
(Continued)

FOREIGN PATENT DOCUMENTS

CN    102110756 A    6/2011
JP    2007-149896 A  6/2007
(Continued)

*Primary Examiner* — Matthew E Warren
(74) *Attorney, Agent, or Firm* — Volpe and Koenig, P.C.

(57) ABSTRACT

An LED module includes a substrate having a high thermal conductivity and at least one LED die mounted on the substrate. A wavelength conversion material, such as phosphor or quantum dots in a binder, has a very low thermal conductivity and is formed to have a relatively high volume and low concentration over the LED die so that the phosphor or quantum dots conduct little heat from the LED die. A transparent top plate, having a high thermal conductivity, is positioned over the wavelength conversion material, and a hermetic seal is formed between the top plate and the substrate surrounding the wavelength conversion material. The LED die is located in a cavity in either the substrate or the top plate. In this way, the temperature of the wavelength conversion material is kept well below the temperature of the LED die. The sealing is done in a wafer level process.

8 Claims, 5 Drawing Sheets

(51) Int. Cl.
  *H01L 33/48* (2010.01)
  *H01L 33/50* (2010.01)
  *H01L 33/54* (2010.01)
  *H01L 33/62* (2010.01)
  *H01L 33/64* (2010.01)
  *H01L 33/58* (2010.01)

(52) U.S. Cl.
  CPC ............ *H01L 33/505* (2013.01); *H01L 33/54* (2013.01); *H01L 33/62* (2013.01); *H01L 33/642* (2013.01); *H01L 33/58* (2013.01); *H01L 2924/0002* (2013.01); *H01L 2933/0041* (2013.01)

(58) Field of Classification Search
  USPC .............................................. 257/88, 98–100
  See application file for complete search history.

(56) References Cited

U.S. PATENT DOCUMENTS

| | | |
|---|---|---|
| 2003/0189217 A1 | 10/2003 | Imai |
| 2007/0152229 A1 | 7/2007 | Yoshida et al. |
| 2007/0241357 A1* | 10/2007 | Yan .................... H01L 25/0753 257/98 |
| 2008/0029774 A1 | 2/2008 | Shishov et al. |
| 2008/0203412 A1* | 8/2008 | Shyu ....................... H01L 33/58 257/98 |
| 2008/0237540 A1 | 10/2008 | Dubrow |
| 2010/0133556 A1 | 6/2010 | Li et al. |
| 2011/0193105 A1 | 8/2011 | Lerman et al. |
| 2011/0198644 A1* | 8/2011 | Hwang ................... H01L 33/44 257/98 |
| 2011/0317397 A1 | 12/2011 | Trottier et al. |
| 2012/0034716 A1* | 2/2012 | Lin ........................ H01L 33/58 438/27 |
| 2012/0133268 A1 | 5/2012 | Hwu et al. |
| 2012/0171789 A1* | 7/2012 | Suehiro ................... H01L 33/56 438/28 |
| 2014/0299902 A1* | 10/2014 | Zimmerman ........... H01L 33/62 257/98 |

FOREIGN PATENT DOCUMENTS

| | | |
|---|---|---|
| JP | 2007-243052 A | 9/2007 |
| JP | 2007-250817 A | 9/2007 |
| JP | 2010-177375 A | 8/2010 |
| JP | 2011-171357 A | 9/2011 |
| JP | 2011-249729 A | 12/2011 |
| JP | 2012-134435 A | 7/2012 |
| JP | 2012-156409 A | 8/2012 |
| TW | 201208132 A | 2/2012 |

* cited by examiner

LED MODULE WITH HERMETIC SEAL OF WAVELENGTH CONVERSION MATERIAL

CROSS-REFERENCE TO PRIOR APPLICATIONS

This application is the U.S. National Phase application under 35 U.S.C. § 371 of International Application No. PCT/IB2014/058875, filed on Feb. 10, 2014, which claims the benefit of U.S. Patent Application No. 61/763,081, filed on Feb. 11, 2013. These applications are hereby incorporated by reference herein.

FIELD OF THE INVENTION

This invention relates to light emitting diodes (LEDs) and, in particular, to a technique for hermetically sealing a phosphor or quantum dot layer above the LED die.

BACKGROUND

It is common to coat a blue LED die with phosphor or quantum dots (QDs), then encapsulate the structure with a transparent polymer encapsulant, such as silicone, epoxy, or other polymer. The phosphor or QDs convert the blue light to one or more other wavelengths, and the combination of blue light leaking through the wavelength-conversion layer and the converted wavelength(s) can create a wide range of colors, including white light.

Many types of phosphor and QDs are air-sensitive, causing them to degrade when heated and exposed to the moisture in air.

The polymers conventionally used to encapsulate an LED die and the wavelength-conversion material are inadequate when the flux and temperature reach beyond 2 W/cm$^2$ and 80° C. An encapsulant for high brightness LEDs much also have good thermal conductivity to conduct the heat from the LED die to the ambient air. Conventional polymers do not have adequate thermal conductivity for a high brightness/high temperature LED die.

A new sealing technique is needed that hermetically seals phosphor or QDs overlying a high brightness LED die, where the technique also provides good thermal conductivity between the LED die and ambient air. The technique should incur relatively low cost and should be highly reliable. Preferably, for high brightness (i.e., high flux) LED dies, the hermetic seal should remain reliable at temperatures well above 80° C. and with a light flux up to 20 W/cm$^2$, and the temperature of the phosphor or quantum dots should be kept below 130° C. to avoid degradation.

SUMMARY

In one embodiment, a highly thermally conductive substrate, provided as a wafer, is molded to have cavities. The substrate may be glass, ceramic, or other thermally conductive material. The cavities have reflective surfaces or the substrate is transparent. One or more high brightness blue LED dies may have their electrodes bonded to corresponding electrodes in each cavity. The substrate includes conductors that connect the cavity electrodes to suitable pads for soldering the substrate, after singulation, to a printed circuit board or another substrate.

A phosphor or quantum dot material is then deposited in the cavities to completely or partially fill the cavities. The phosphor or quantum dot material may be formed by mixing phosphor powder or quantum dots in a transparent binder.

A thermally conductive, transparent ceramic or glass plate (provided as a wafer) is then mounted over the substrate wafer, and a thermally conductive hermetic seal is created surrounding each cavity, such as by laser-fusing the plate to the substrate, soldering the plate to the substrate, or providing other types of high temperature seals around the cavity. The bonded top plate wafer and substrate wafer are then singulated to form individual LED modules.

Since the LED die is not directly contacting the seal, the LED die may generate high heat and high flux without degrading the seal.

In another embodiment, the substrate on which the LED dies are mounted is substantially flat, and the transparent plate has cavities surrounding the phosphor or quantum dots. The portions of the plate surrounding each cavity are then bonded to the substrate to form a high temperature seal.

In one embodiment, the transparent plate has a plurality of separate sub-cavities for the wavelength conversion material for each LED module which remain after singulation, so that a failure of a seal for one cavity does not affect the seal of the other cavities.

In another embodiment, the substrate on which the LED dies are mounted is substantially flat, the wavelength conversion material is molded (or otherwise deposited) over the LED dies to encapsulate the LED dies, and the transparent plate has cavities that surround each LED die. The portions of the plate surrounding each cavity are then bonded to the substrate to form a high temperature seal.

Since the hermetic seals are formed during a wafer level process, and the resulting wafer is then singulated to create individual LED modules, the process is low cost. The edges of the top plate will coincide with the edges of the substrate after singulation, resulting in a very compact LED module.

By far, the lowest thermally conductive material in the structure is the wavelength conversion material, including its binder. The disclosed structures allow the wavelength conversion material to have a relatively large volume and low concentration of phosphor. The low thermal conductivity of the material limits the heating of the material, while a vast majority of the LED die heat is dissipated by the substrate and transparent plate (via the seal connection). Thus, the large volume of wavelength conversion material experiences a reduced heat and flux, resulting in less degradation, if any, of the phosphor over time. The benefits apply equally when quantum dots are used as the wavelength conversion material. The wavelength conversion material may even include a combination of phosphor and quantum dots.

The structures limit the temperature of the wavelength conversion material to less than 130° C., even with the highest brightness LEDs, while maintaining a good hermetic seal.

Other embodiments are disclosed.

BRIEF DESCRIPTION OF THE DRAWINGS

Elements that are the same or similar are labeled with the same numeral.

DETAILED DESCRIPTION

Figure 1:
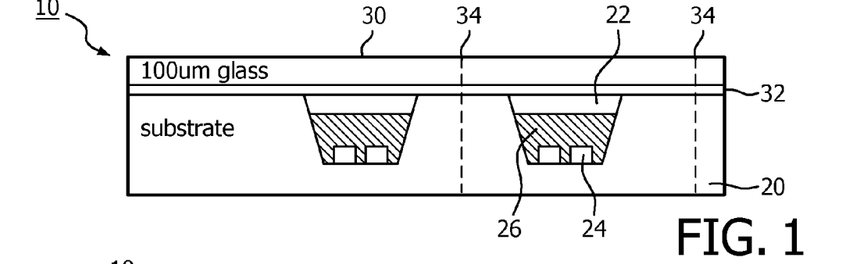
FIG. 1 is a cross-sectional view of a portion of a wafer prior to singulation, wherein the substrate has cavities, each cavity containing one or more LEDs dies. The cavities are filled with a wavelength conversion material, and the cavities are hermetically sealed by a flat transparent plate.

FIG. 1 illustrates a portion of a wafer 10 prior to singulation. Wafer 10 includes a substrate 20 and a transparent plate 30. The substrate 20 is formed of a high thermal conductivity material. The substrate 20 may be formed of, for example, a transparent ceramic such as sapphire, spinel, or polycrystalline alumina. The substrate 20 may also be formed of any other transparent or non-transparent ceramic material, including a molded ceramic material where ceramic powder is molded and sintered under pressure. In other embodiments, the substrate 20 may be a glass-ceramic. In another embodiment, the substrate 20 may be a metal lead frame encased in an elastomer body.

In FIG. 1, the substrate 20 is molded or machined to have cavities 22. The cavity 22 walls may be coated with a reflective film (preferably at least 90% reflective for visible light) if the substrate 20 is formed of a light absorbent material. The substrate 20 may even be formed of a reflective material, such as a white ceramic material. In the alternative, the reflectivity of the film or the substrate 20 may be for non-visible light, e.g., UV light.

The bottom of each cavity 22 has conventional electrodes (not shown) that are electrically connected to conventional bottom metal pads (not shown) on the substrate 20 for soldering the singulated LED modules to a printed circuit board (PCB) or other substrate. The cavity electrodes are positioned to correspond to the electrodes on the particular LED dies 24 used, such as flip chip LEDs, vertical LEDs, etc. The substrate 20 may be molded to contain vias, and metal is deposited and patterned to form the various electrodes in the cavities 22, fill in the vias, and form the metal pads on the bottom surface of substrate 20 using conventional techniques. The electrodes provide a thermal conductivity path between the LED dies 24 and the substrate 20. An electrically insulated, metal thermal pad may also be located on the bottom of the LED dies 24 and bonded to a metal thermal pad in the cavities 22.

If the substrate 20 has a top surface that offers poor adhesion, such as a porous surface, a top layer, such as a sealant layer, may be deposited on the substrate 20 surface to achieve a better hermetic seal between the substrate 20 and the top plate (described below).

In one embodiment, the LED dies 24 are high brightness LED dies that emit blue light. Such LED dies 24 generate relatively high heat, and such heat needs to be spread and removed by the substrate 20 and the PCB to which the substrate 20 is later mounted on via conduction. The heat conducted horizontally and then vertically upward through the substrate 20 is preferably not blocked by any overlying structure so that ambient air above the substrate 20 may also remove the heat by conduction and/or convection.

In FIG. 1, four LED dies 24 are mounted in each cavity 22 for additional brightness, but only two are shown per cavity 22 in the cross-section.

The cavities 22 are then filled or partially filled with a wavelength conversion material 26. Such material 26 will typically be phosphor powder in a binder or quantum dots dispersed in a carrier. The carrier for the quantum dots will also be referred to as a binder. The quantum dots, being of sub-micro size, do not settle and remain fairly well dispersed in the binder. The transparent binding material may be a polymer, such as silicone. Many types of phosphors and quantum dots degrade with high heat, so one goal of the present invention is to provide a structure that allows the heat to be removed from the LED die while limiting the heating of the wavelength conversion material.

The volume of each cavity 22 is much larger than the volume of each LED die 24. Thus, the volume of the wavelength conversion material 26 is relatively high, enabling the phosphor particles or quantum dots to have a low concentration. The thermal conductivity of the wavelength conversion material (including its binder) is orders of magnitude lower than the thermal conductivity of the substrate 20 (e.g., 0.1-0.2 W/mK vs. 30 W/mK). So, the large volume and low thermal conductivity of the wavelength conversion material 26 limits the heat conducted to the phosphor particles or quantum dots. In other words, the heat diffusion length within the material 26 is very small. Therefore, the phosphor particles or quantum dots do not significantly degrade despite the high heat generated by the LED dies 24 if they are distributed throughout the wavelength conversion material 26.

Additionally, if the quantum dots contain toxic elements such as cadmium, the RoHS directive (Restriction of the Use of Certain Hazardous Substances) requires a dilution of the cadmium metal in the quantum dot film to meet compliance. This can be achieved by increasing the volume of the binder and reducing the quantum dot concentration while still maintaining the desired color emission (such as a desired warm-white color point).

Any void between the top of the wavelength conversion material 26 and the top of the cavity 22 may be filled with the transparent binder material to avoid air pockets and attendant reflection effects.

Next, a flat transparent ceramic, glass, or elastomer plate 30 is provided. Other material may also be suitable. The plate 30 will be about the same size as the substrate 20 wafer. In one embodiment, the plate is about 100 microns thick to minimize light absorption and create a high thermal conductivity path to the ambient air.

A transparent sealant material 32 is deposited, such as by screen printing, on the plate 30 and/or on the substrate 20 to surround each cavity 22. The sealant material 32 should have good thermal conductivity and cover a wide area so that heat is conducted to the plate 30 and to the ambient air. The sealant material 32 may be a low temperature glass, glass frit, metal, metal oxide, high thermal conductivity epoxy, or other suitable material that can form a hermetic seal. In one embodiment, the sealant material 32 is heated or cured by laser annealing, laser heating, oven heating, or optically curing to create the hermetic seal. The sealant material 32 and other materials should be selected to have similar coefficients of thermal expansion to avoid delamination during operation.

The sealing process may be performed in a vacuum to remove air from the cavities 22, and downward pressure may be applied to the plate 30.

The resulting wafer is then singulated, such as by sawing, along the lines 34 to form individual LED modules. The combination of the blue light and the light generated by the wavelength conversion material 26 may create virtually any color light.

The combination of the substrate 20, sealant material 32, and plate 30, all being of high thermal conductivity material, removes heat from the LED dies 24 by conducting the heat to ambient air and to a thermally conductive printed circuit board (e.g., a circuit board having a metal body), allowing most or all of the low thermal conductivity wavelength conversion material 26 to remain under 130° C., which is adequate for most wavelength conversion materials to avoid degradation.

Since the sealant material 32 is remote from the high flux blue light and an opaque reflective layer in the cavities 22 may block the light impinging on the sealant material 32, the requirement for the sealant material 32 to withstand high flux is reduced.

Figure 2:
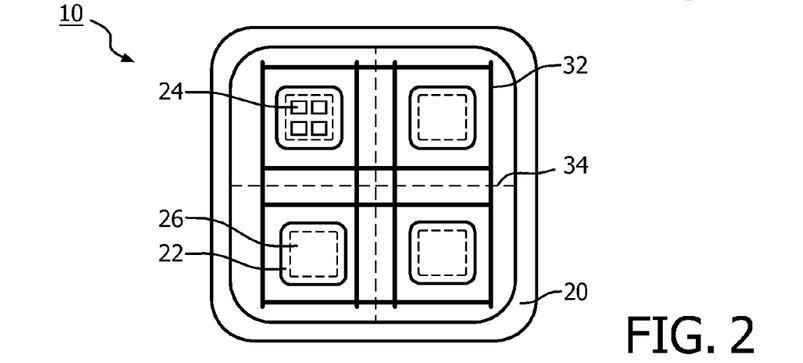
FIG. 2 is a top down view of a portion of the wafer of FIG. 1, showing the seal around each cavity (the seal is shown greatly narrowed for ease of identification).

FIG. 2 is a top down view of a portion of the wafer 10 of FIG. 1, showing a possible location of the sealant material 32 around each cavity 22. The sealant material 32 is illustrated as a narrow "bead" that is not to scale for a typical embodiment in order to illustrate its location. In another embodiment, the entire surface of the plate 30 is coated with the sealant material 32 to increase thermal conductivity to the substrate 20.

Figure 3:
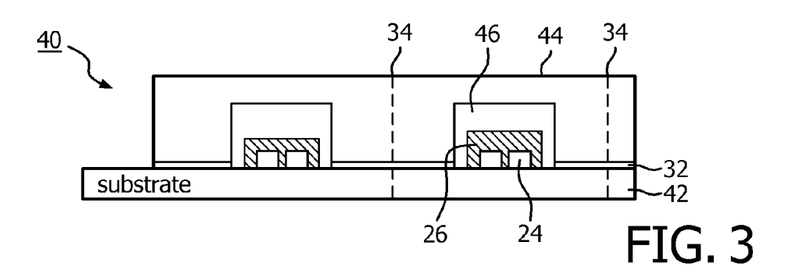
FIG. 3 is a cross-sectional simplified view of a portion of a wafer prior to singulation, wherein the substrate is substantially flat and supports LED dies, wherein the wavelength conversion material is molded over each LED die to encapsulate the LED dies, wherein a transparent plate has cavities, and wherein a hermetic sealed is formed around each cavity.

FIG. 3 is a cross-sectional simplified view of a small portion of a wafer 40 prior to singulation, wherein the substrate 42 is substantially flat and supports LED dies 24. The LED dies 24 have conventional metal electrodes (anode and cathode) that are electrically and thermally connected to corresponding electrodes on the substrate 42, as discussed with respect to FIG. 1.

The substrate 42 (as a wafer) is brought against a mold having cavities filled with the uncured wavelength conversion material 26. The wavelength conversion material 26 encapsulates the LED dies 24. The material 26 is then cured, and the substrate 42 is released from the mold. Preferably, the resulting molded material 26 is relatively thick with a low concentration of phosphor particles or quantum dots in the low thermal conductivity transparent binder so that most or all of the phosphor particles or quantum dots are not subject to high heat.

A transparent plate 44, such as formed of glass or a ceramic, is molded, machined, etched, or otherwise formed to have cavities 46. Under a vacuum, the plate 44 is sealed to the substrate 42 by the sealant material 32, which may be the same as described with respect to FIG. 1 and cured in the same ways. Preferably the amount of air should be minimized in the gap between the molded material 26 and the top of the cavities 46 to avoid delamination when the LED dies 24 generate heat during operation. The wafer is then singulated along the lines 34.

Due to the sealant material 32 used, the spreading of the sealant material 32 over a wide area, the distribution of the heat and flux from the LED dies 24, the high thermal conductivity of the substrate 42 and plate 44, and the low conductivity and large volume of the wavelength conversion material 26, the seal is reliable at high heat and flux and the phosphor or quantum dots are not subjected to high heat.

In all embodiments, the high thermal conductivity materials, including the substrate and top plate should have a conductivity greater than 20 W/mK. Since the sealant material may be very thin, its thermal conductivity is not critical, although it is preferable for it to be high.

The flat substrate 42 preferably has a reflective layer on its top surface, which may be specular or diffusively reflective, to reflect light upwards. The reflective layer may be metal, a white paint, etc.

Figure 4:
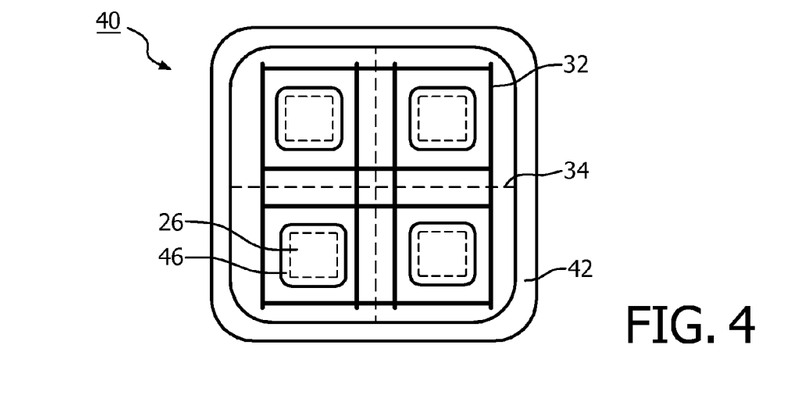
FIG. 4 is a top down view of a portion of the wafer of FIG. 3, showing the seal around each plate cavity.

FIG. 4 is a top down view of a small portion of the wafer 40 of FIG. 3, showing the sealant material 32 location around each plate cavity 46. The sealant material 32 is spread out over a much larger area, as shown in FIG. 3, but is illustrated as a narrow "bead" that is not to scale, for a typical embodiment shown in FIG. 4, to better illustrate the general location of sealing.

Figure 5:
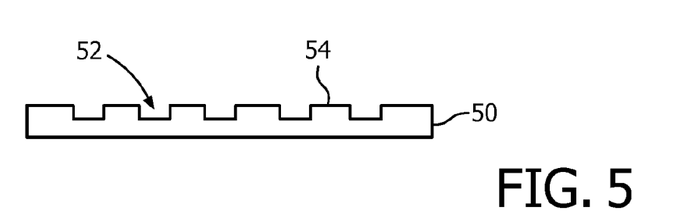
FIG. 5 is a cross-sectional view of a portion of a plate for a single singulated LED module that has an optical pattern that shapes the light emission. The optical pattern may form lenses, light scattering features, reflectors, light absorbers, or form any other features.

FIG. 5 is a cross-sectional view of a plate 50 for a single singulated LED module. The bottom of the plate 50 is to be sealed to a substrate, such as shown in FIG. 1 or 3. The bottom of the plate 50 may be flat or have cavities. FIG. 5 is intended to illustrate that the plate 50 may include optical features 52 that may scatter light, or form lenses, or redirect light, or absorb light, or reflect light, for example. In the simplified example of FIGS. 5 and 6, the optical features 52 are cylindrical indentations.

Figure 6:
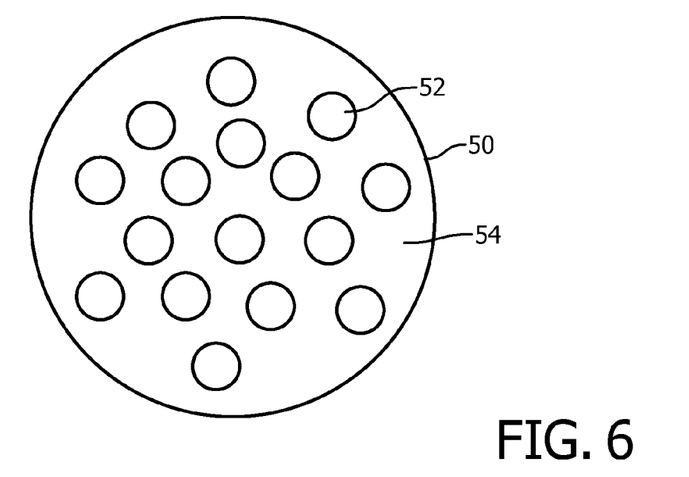
FIG. 6 is a top down view of the plate portion of FIG. 5.

FIG. 6 is a top down view of the plate 50 shown in FIG. 5, where the optical features 52 are shown as circular indentations in the plate 50. The plate 50 may also include a reflective film 54 over the other areas so that most of the light is emitted almost exclusively through the circular indentations. By providing the plate 50 with a non-planar top surface, internal reflection is reduced. In another embodiment, the indentations are angled prisms to increase light extraction. The plate 50 is shown as circular but may be rectangular or any other suitable shape.

Figure 7:
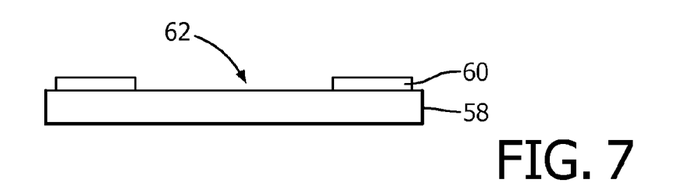
FIG. 7 is a cross-sectional view of a portion of a plate for a single singulated LED module, illustrating a reflective ring formed around a single LED die area to concentrate the light emission to the central area.

FIG. 7 is a cross-sectional view of a plate 58 for a single singulated LED module, illustrating a reflective ring 60 formed around a single LED die area to limit the light emission to the central area 62. The bottom of the plate 58 may be flat or have cavities and is sealed to the substrate, as described above. The ring 60 may be deposited aluminum, silver, or other reflective material. LED light rays impinging on the bottom surface of the ring 60 are directed downwards and reflect back up off the reflective surface of the substrate, such as substrate 42 in FIG. 3.

Figure 8:
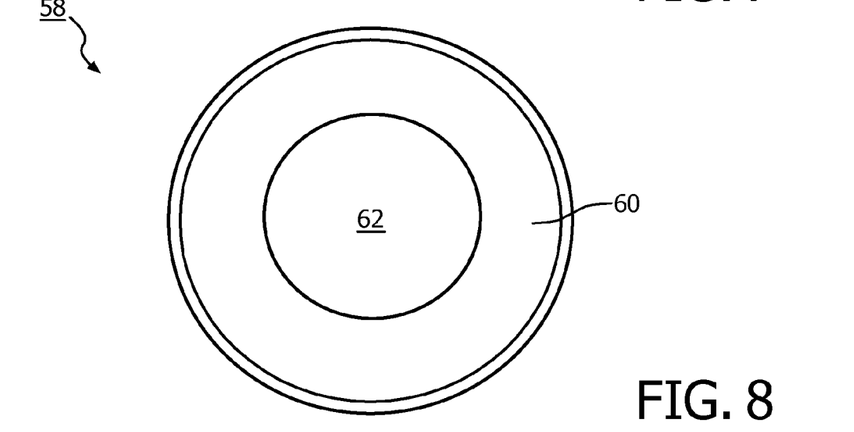
FIG. 8 is a top down view of the plate portion of FIG. 7.

FIG. 8 is a top down view of the plate 58 of FIG. 7 showing the reflective ring 60 and the transparent central area 62. The plate 58 may also be rectangular or any other suitable shape.

Figure 9A:
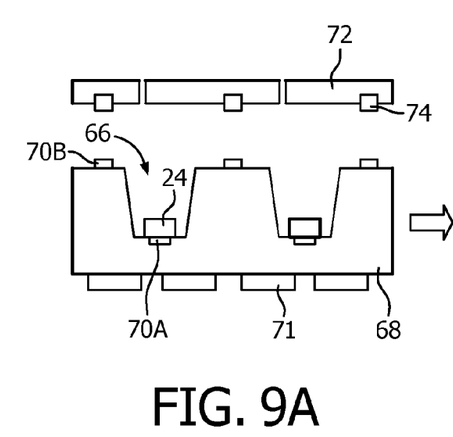
FIGS. 9A and 9B are cross-sectional views of a portion of a wafer wherein the LED dies are mounted in cavities in the substrate and metal-bonded, such as with a low-temperature AuSn solder, using heat, and wherein the hermetic seal of the plate is simultaneously formed using the same solder.
Figure 9B:
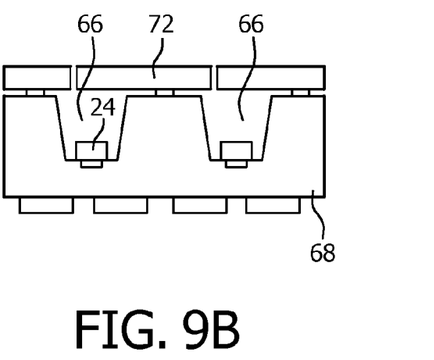

FIGS. 9A and 9B are cross-sectional views of a portion of a wafer wherein the LED dies 24 are mounted in cavities 66 in the substrate 68 and metal-bonded to the substrate electrodes, such as with a low-temperature AuSn solder 70A, using heat, and wherein the hermetic seal of the plate 72 is simultaneously formed using the same solder 70B. The solder 70A bonding the LED dies 24 to the substrate electrodes provide electrical conductivity to conventional anode and cathode bottom pads 71 on the substrate 68 and also provide thermal conductivity to the substrate 68 body. An electrically insulated large thermal pad may also be provided. The plate 72 is provided with metal rings 74 that are bonded to the solder 70B to form a hermetic seal with the substrate 68.

The solder 70B and metal ring 74 may be much wider than shown in FIGS. 9A and 9B to provide a wide seal with good thermal conductivity between the top plate 72 and the substrate 68.

Figure 10A:
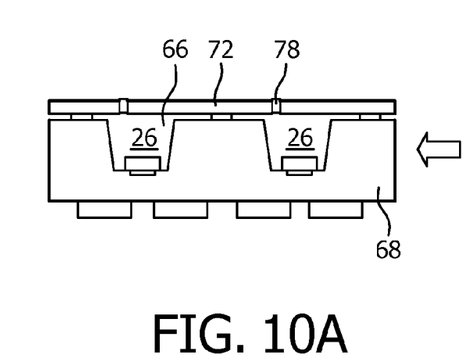
FIG. 10A illustrates how the cavities in the structure of FIG. 9B are then filled with the wavelength conversion material through openings in the plate so the wavelength conversion material avoids the solder heating step of FIG. 9B.

FIG. 10A illustrates how the cavities 66 in the substrate 68 of FIG. 9B are then substantially completely filled with the wavelength conversion material 26 (to prevent air gaps) through small openings 76 in the plate 72 so the wavelength conversion material 26 avoids the solder 70 heating step of FIG. 9B. The wavelength conversion material 26 has a relatively large volume, has low thermal conductivity, and has a low concentration of phosphor particles or quantum dots to limit the temperature of the phosphor particles or quantum dots. In an alternative embodiment, multiple openings 76 are used for each cavity 66 to allow air to escape as the wavelength conversion material 26 is introduced. Likewise some of the openings 76 may be connected to a vacuum source to "pull" conversion material 26 into cavities 66.

Figure 10B:
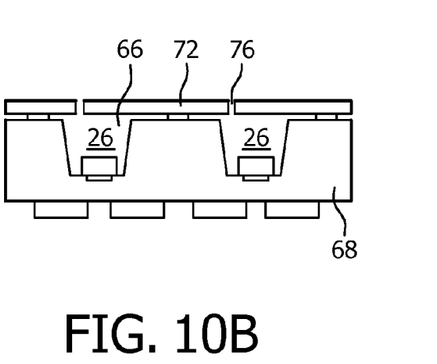
FIG. 10B illustrates how the openings in the plate are then filled to complete the hermetic seal.

FIG. 10B illustrates how the openings 76 in the plate 72 are then filled with another type of sealant material 78 (e.g., silicone or epoxy) to complete the hermetic seal.

The resulting wafer may then be singulated, such as through the middle of the structure of FIG. 10B.

Figure 11:
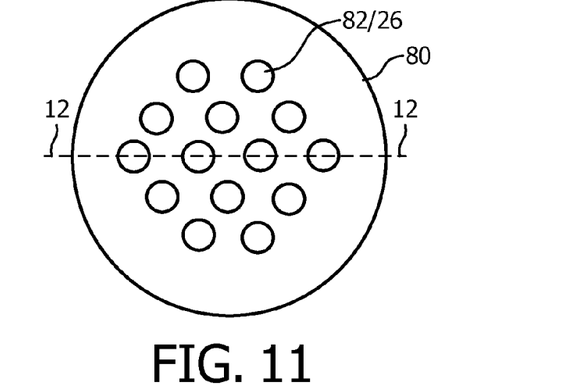
FIG. 11 is a top down view of a portion of a plate for a single singulated LED module having a plurality of sealed cavities, forming vertical cylinders, containing wavelength conversion material.

FIG. 11 is a top down view of a plate 80 for a single singulated LED module having a plurality of sealed cavities 82, forming vertical cylinders, containing wavelength conversion material 26.

Figure 12:
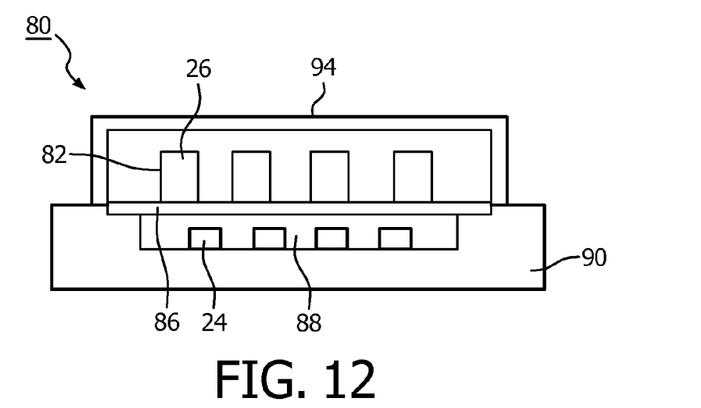
FIG. 12 is a cross-sectional view of a single LED module after singulation using the plate of FIG. 11, viewed along line 12-12 in FIG. 11, wherein a wavelength conversion material fills the cavities in the plate and wherein the plate is covered by an optional phosphor layer to generate additional wavelengths.

FIG. 12 is a cross-sectional view of a single LED module 84 after singulation using the plate 80 of FIG. 11, viewed along line 12-12 in FIG. 11. The wavelength conversion material 26 is sealed in the cavities 82 by a transparent sealing plate 86, which also may form a hermetic seal around a central cavity 88 in a substrate 90 in which LED dies 24 are mounted. Any of the sealant materials described above may be used around the periphery of the cavity 88. The plate 80 is optionally covered by a remote phosphor layer 94 to generate additional wavelengths. Due to the remoteness of the various wavelength conversion materials from the LED dies 24, the materials are not subjected to high temperatures and do not degrade. If the hermetic seal of any one of the cavities 82 is broken, it does not affect the seal for the other cavities 82.

Figure 13:
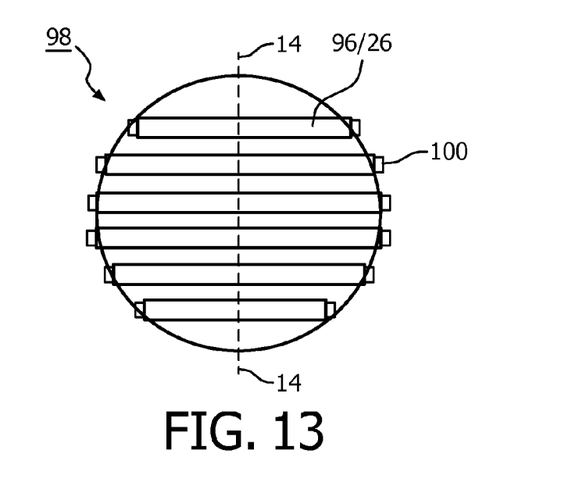
FIG. 13 is similar to FIG. 11, except that the cavities in the plate are horizontal cylinders filled with a wavelength conversion material which are sealed after singulation.

FIG. 13 is similar to FIG. 11, except that the cavities 96 in the plate 98 are horizontal cylinders filled with a wavelength conversion material 26. The cavities 96 extend all the way to the edges of the plate 98, and the open ends of the cavities 96 are sealed by a suitable sealant material 100, such as silicone or epoxy. The cavities 96 may be filled by capillary action.

Figure 14:
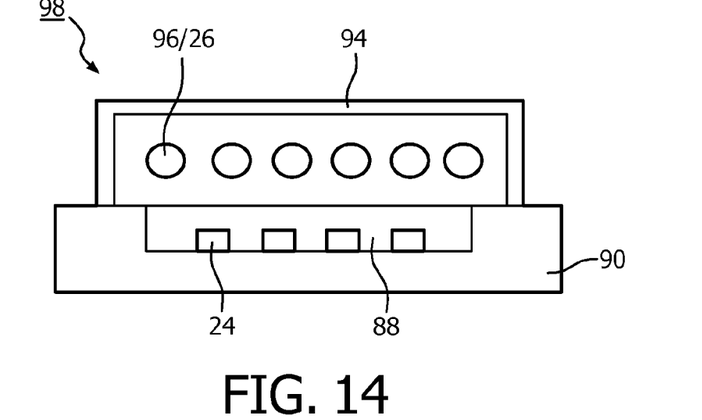
FIG. 14 is a cross-sectional view of a single LED module after singulation using the plate of FIG. 13, viewed along line 14-14 in FIG. 13, wherein a wavelength conversion material fills the cavities and wherein the plate is covered by an encapsulant (containing phosphor particles) to seal the ends of the cavities.

FIG. 14 is a cross-sectional view of a single LED module after singulation using the plate 98 of FIG. 13, viewed along line 14-14 in FIG. 13. Plate 98 is mated to the same substrate 90 as described with respect to FIG. 12. The periphery of the plate 98 surrounding the substrate cavity 88 includes a hermetic seal, as described above. The sealing of the ends of the cavities 96 may be by the silicone binder material in the optional phosphor layer 94 over the plate 98.

Figure 15:
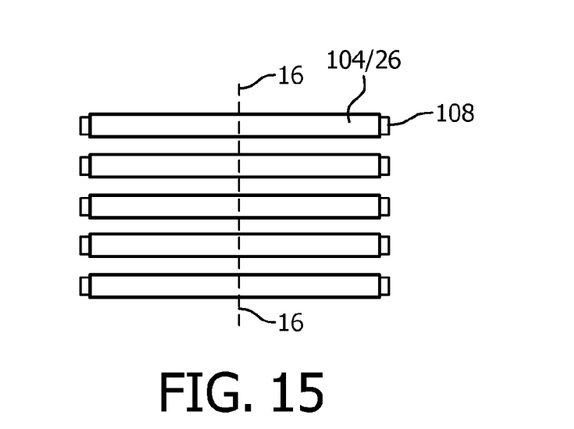
FIG. 15 is a top down view of hollow strips, made of ceramic or glass, that have been filled with a wavelength conversion material by capillary action. Alternatively, a sub-plate may contain horizontal cavities filled with the wavelength conversion material.

FIG. 15 is a top down view of ceramic or glass hollow strips 104 that have been filled with a wavelength conversion material 26 by capillary action. Alternatively, a sub-plate may contain horizontal cavities filled with the wavelength conversion material 26.

Figure 16:
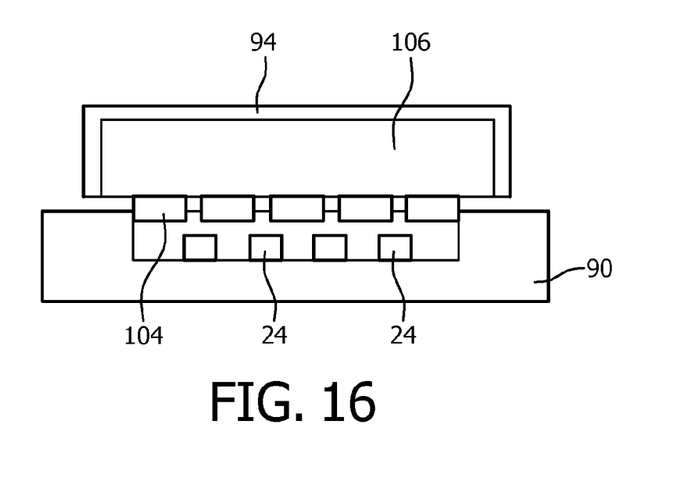
FIG. 16 is a cross-sectional view of a single LED module after singulation using the strips or sub-plate of FIG. 15, viewed along line 16-16 in FIG. 15, wherein the strips or sub-plate are/is bonded to a top plate that is then bonded to a substrate having cavities containing LED dies. The bond creates a hermetic seal. If required, the ends of the horizontal cavities are then hermetically sealed with an encapsulant.

FIG. 16 is a cross-sectional view of a single LED module after singulation using the strips 104 or sub-plate of FIG. 15, viewed along line 16-16 in FIG. 15, wherein the strips 104 or sub-plate is bonded to a top plate 106 that is then sealed to a substrate 90 having cavities 88 containing LED dies 24. If required, the ends of the horizontal cavities 104 are hermetically sealed with a suitable sealant material 108 (FIG. 15). An optional phosphor layer 94 may be deposited over the plate 106.

In FIGS. 11-16, the parts are shown for a single LED module. However, if the modules are sealed using the top plate during a wafer level process (prior to singulation), the edges of the top plate and the substrate will coincide for a collection of LED modules after singulation, similar to FIGS. 1 and 3. This greatly reduces the cost of the LED module.

In all embodiments, the wavelength conversion material 26 temperature is kept relatively low, and the sealant material provides a reliable hermetic seal, despite the high heat and flux generated by the LED die by the combination of the various factors described herein, even with high brightness LED dies.

Preferably, in all embodiments, there is no air trapped in the cavity to avoid delamination when the LED module is heated by operating the LED die. This may be accomplished by completely filling the cavity or performing the hermetic seal step in a vacuum.

By sealing the top plate to the substrate as wafers and then singulating the wafer, the edges of the top plate will typically coincide with the edges of the substrate. Forming the hermetic seal in a wafer process is much less expensive than sealing each module after singulation. Accordingly, the process described herein may be performed with little extra cost per LED module.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An LED module comprising:
a substrate having a first thermal conductivity;
a plurality of LED dies electrically and thermally mounted on the substrate, wherein the LED dies are connected in parallel;
a wavelength conversion material having a second thermal conductivity substantially lower than the first thermal conductivity, the wavelength conversion material located overlying the LED dies;
a light transmitting top plate having a third thermal conductivity greater than the second thermal conductivity, the top plate being positioned over the wavelength conversion material; and
a hermetic seal formed by a sealant material between the top plate and the substrate surrounding the plurality of LED dies and wavelength conversion material,
the LED module having first flat sidewall edges around its periphery, the top plate having second flat sidewall edges around its periphery, and the substrate having third flat sidewall edges around its periphery, wherein the second flat sidewall edges and the third flat sidewall edges coincide to form the first flat sidewall edges of the LED module due to the top plate and the substrate being sealed during a wafer level process and the wafer then singulated to form the LED module,
the plurality of LED dies being located in a reflective single cavity formed in the substrate, the cavity having walls that surround all the LED dies, wherein the wavelength conversion material overlies the LED dies and at least partially fills the cavity,
wherein the wavelength conversion material is deposited into the cavity using the cavity as a mold for the wavelength conversion material, and wherein the top plate has one or more openings formed in it which are located directly over the cavity for depositing the wavelength conversion material into the cavity after the hermetic seal is formed.

2. The module of claim 1, wherein the top plate comprises glass and wherein the sealant material comprises glass that has been melted to affix the top plate to the substrate.

3. The module of claim 1, wherein the sealant material comprises a metal solder, wherein the plurality of LED dies are bonded to a substrate electrode using the same metal solder, and wherein the hermetic seal is formed when the substrate is heated to melt the metal solder.

4. The module of claim 1, wherein the top plate is hermetically sealed to the substrate as a wafer, and the wafer is singulated to form the LED module.

5. The module of claim 1, wherein the top plate has optical features that redirect light emitted by the plurality of LED dies.

6. The module of claim 1, wherein the cavity is one of a plurality of cavities in the substrate containing the wavelength conversion material, wherein each of the cavities is sealed so that a break in the hermetic seal of one cavity does not break the hermetic seal of another cavity.

7. The module of claim 1, wherein the wavelength conversion material comprises at least one of phosphor particles in a binder or quantum dots in a binder.

8. The module of claim 1, wherein heat generated by the plurality of LED dies is at least partially removed by thermal conduction of the substrate, the sealant material, and the top plate, and wherein a temperature of the wavelength conversion material is kept lower than a temperature of the LED die.

* * * * *